(12) United States Patent
Huh et al.

(10) Patent No.: US 11,281,832 B2
(45) Date of Patent: Mar. 22, 2022

(54) DEVICE FOR GENERATING VERIFICATION VECTOR FOR CIRCUIT DESIGN VERIFICATION, CIRCUIT DESIGN SYSTEM, AND REINFORCEMENT LEARNING METHOD OF THE DEVICE AND THE CIRCUIT DESIGN SYSTEM

(71) Applicant: SAMSUNG ELECTRONICS CO., LTD., Suwon-si (KR)

(72) Inventors: In Huh, Seoul (KR); Jeong-hoon Ko, Hwaseong-si (KR); Hyo-jin Choi, Seoul (KR); Seung-ju Kim, Suwon-si (KR); Chang-wook Jeong, Hwaseong-si (KR); Joon-wan Chai, Seoul (KR); Kwang-il Park, Yongin-si (KR); Youn-sik Park, Hwaseong-si (KR); Hyun-sun Park, Seoul (KR); Young-min Oh, Suwon-si (KR); Jun-haeng Lee, Hwaseong-si (KR); Tae-ho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/788,924

(22) Filed: Feb. 12, 2020

(65) Prior Publication Data
US 2020/0257840 A1 Aug. 13, 2020

(30) Foreign Application Priority Data

Feb. 13, 2019 (KR) ........................ 10-2019-0016842

(51) Int. Cl.
*G06F 30/33* (2020.01)
*G06N 3/08* (2006.01)

(52) U.S. Cl.
CPC ............... *G06F 30/33* (2020.01); *G06N 3/08* (2013.01)

(58) Field of Classification Search
USPC ........................................................ 716/106
See application file for complete search history.

(56) References Cited

U.S. PATENT DOCUMENTS

| 7,281,185 | B2 | 10/2007 | Maoz et al. |
| 8,892,487 | B2 | 11/2014 | Chang et al. |
| 9,256,371 | B2 | 2/2016 | Franceschini et al. |
| 9,792,397 | B1 | 10/2017 | Nagaraja |
| 9,965,901 | B2 | 5/2018 | Zhang et al. |

(Continued)

OTHER PUBLICATIONS

Lantao Yu et al. "SeqGAN: Sequence Generative Adversarial Nets with Policy Gradient" Association for the Advancement of Artificial Intelligence (www.aaai.org), 2017, (11 pages total).

*Primary Examiner* — Bryce M Aisaka
(74) *Attorney, Agent, or Firm* — Sughrue Mion, PLLC

(57) ABSTRACT

A device for verifying a circuit design including a first circuit block and a second circuit block includes a verification vector generator and a design verifier. The verification vector generator determines a first verification vector by performing reinforcement learning through neural network computation based on a coverage corresponding to a first test vector, the coverage being determined based on a state transition of the first circuit block generated by inputting the first test vector to the first circuit block. The design verifier performs design verification for the first circuit block by using the first verification vector.

12 Claims, 15 Drawing Sheets

(56) References Cited

U.S. PATENT DOCUMENTS

| | | |
|---|---|---|
| 10,084,476 B1 | 9/2018 | Zhao et al. |
| 2017/0074932 A1 | 3/2017 | Kourfali et al. |
| 2017/0344669 A1 | 11/2017 | Jeong et al. |
| 2018/0026649 A1 | 1/2018 | Harik |
| 2018/0247006 A1 | 8/2018 | Dai et al. |
| 2018/0248562 A1 | 8/2018 | Redfern et al. |
| 2018/0260699 A1 | 9/2018 | Natroshvili et al. |
| 2019/0196952 A1* | 6/2019 | Manchiraju ............ G06N 3/088 |
| 2019/0311290 A1* | 10/2019 | Huang ................... G06N 20/00 |

* cited by examiner

DEVICE FOR GENERATING VERIFICATION VECTOR FOR CIRCUIT DESIGN VERIFICATION, CIRCUIT DESIGN SYSTEM, AND REINFORCEMENT LEARNING METHOD OF THE DEVICE AND THE CIRCUIT DESIGN SYSTEM

CROSS-REFERENCE TO RELATED APPLICATION

This application claims priority from Korean Patent Application No. 10-2019-0016842, filed on Feb. 13, 2019, in the Korean Intellectual Property Office, the disclosure of which is incorporated by reference herein in its entirety.

BACKGROUND

1. Field

Apparatuses, devices, methods and system consistent with the present disclosure relate to a device for generating a verification vector for circuit design verification, and more particularly, to a device for generating a verification vector through machine learning, a circuit design system, and a reinforcement learning method of the device and the circuit design system.

2. Description of Related Art

As digital circuit design technology becomes more complicated and products become more diversified, an operation of verifying the circuit design becomes increasingly complex. However, the current circuit design or product verification process is performed by a rule-based scenario verification method based on experience of engineers, and there are no circuit design-specific or product-specific absolute evaluation criteria. Thus, according to an improvement of the circuit design or the product and a change of utilization of a user, a general verification method may not be able to guarantee quality and performance, and in addition, in a process of solving the above-described difficulties through post-fixing and testing, a huge loss may be generated.

To address such difficulties, there has been an attempt to improve the verification process by introducing an artificial intelligence-based process, for example, a machine learning algorithm. However, there is no numerical metric for evaluating a verification situation, and a length of a verification vector, the amount of computations, and non-conformity exceed a processing limit of the machine learning algorithm, and a simulation cost required for obtaining data for the machine learning is very large.

SUMMARY

It is an aspect to provide a device effectively generating evaluation criteria such as a coverage for a verification vector to verify a circuit design, a circuit design system, and a reinforcement learning method of the device and the circuit design system.

According to an aspect of an exemplary embodiment, there is provided a device for verifying a circuit design including a first circuit block and a second circuit block, the device including a verification vector generator configured to determine a first verification vector by performing reinforcement learning through neural network computation based on a coverage corresponding to a first test vector, the coverage being determined based on a state transition of the first circuit block generated by inputting the first test vector to the first circuit block; and a design verifier configured to perform design verification for the first circuit block by using the first verification vector.

According to another aspect of an exemplary embodiment, there is provided a method of reinforcement learning of a neural network device for generating a verification vector for verifying a circuit design including a circuit block, the method including inputting a test vector to the circuit block; generating at least one reward based on a coverage corresponding to the test vector, the coverage being determined based on a state transition of the circuit block based on the test vector; and applying the at least one reward to the reinforcement learning.

According to another aspect of an exemplary embodiment, there is provided a circuit design system including at least one processor; a circuit design module configured to generate a dynamic random access memory (DRAM) circuit design including a mode register set (MRS) block and a command block by using the at least one processor; a verification vector generation module configured to, by using the at least one processor, perform a first reinforcement learning by using a first test vector in which characteristics of a parameter generating a state transition of the MRS block are reflected, perform a second reinforcement learning by using a second test vector in which characteristics of a parameter generating a state transition of the command block are reflected, and generate a first verification vector for verifying the MRS block and a second verification vector for verifying the command block; and a design verification module configured to, by using the at least one processor, perform verification of the MRS block by using the first verification vector and verification of the command block by using the second verification vector.

BRIEF DESCRIPTION OF THE DRAWINGS

Embodiments will be more clearly understood from the following detailed description taken in conjunction with the accompanying drawings in which.

DETAILED DESCRIPTION

Hereinafter, embodiments are described in detail with reference to the accompanying drawings.

Figure 1:
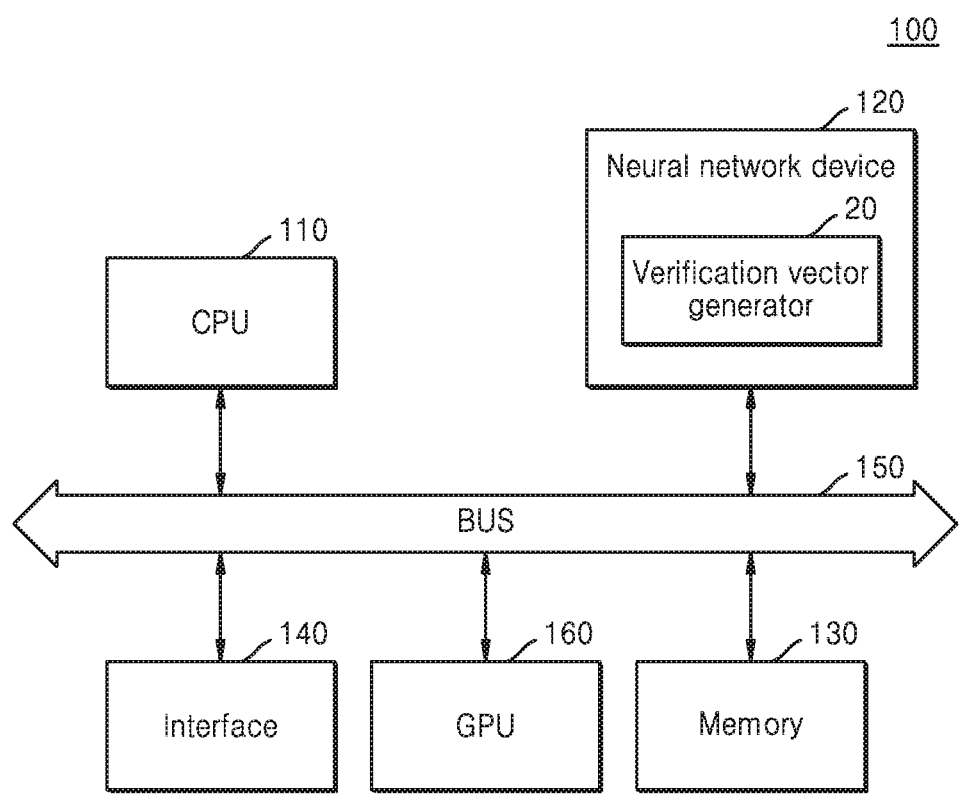
FIG. 1 is a block diagram illustrating a neural network system for generating a verification vector according to an embodiment.

FIG. 1 is a block diagram illustrating a neural network system for generating a verification vector according to an embodiment.

A neural network system 100 may infer information included in input data by training (or learning) a neural network or by analyzing the input data by using the neural network. The neural network system 100 may determine a situation based on the inferred information, or may control components of an electronic device on which the neural network system 100 is mounted. For example, the neural network system 100 may be applied to a circuit design device or a circuit design system for designing and verifying circuits, and in addition, the neural network system 100 may be mounted on one of various kinds of electronic devices. In an embodiment, the neural network system 100 of FIG. 1 may include an application processor.

Referring to FIG. 1, the neural network system 100 may include a central processing unit (CPU) 110, a neural network device 120, a memory 130, an interface 140, a bus 150, and a graphics processing unit (GPU) 160. The neural network system 100 may further include an input/output module, a security module, a power control device, etc., and may further include various types of processors. According to an embodiment, some or all of the components of the neural network system 100 (for example, the CPU 110, the neural network device 120, the memory 130, and the interface 140) may be formed in one semiconductor chip. For example, the neural network system 100 may be implemented as a system-on-chip (SoC). The components of the neural network system 100 may communicate with each other via the bus 150.

The CPU 110 may control an overall operation of the neural network system 100. The CPU 110 may include one processor core (or single core) or a plurality of processor cores (or multi-core). The CPU 110 may process or execute programs and/or data stored in a storage area such as the memory 130.

For example, the CPU 110 may execute an application program and control the neural network device 120 to perform neural network-based tasks according to an execution of the application program. The neural network may include at least one of various types of neural network models such as a convolution neural network (CNN), a region with (R) CNN (R-CNN), a region proposal network (RPN), a recurrent neural network (RNN), a stacking-based (S) deep neural network (DNN) (S-DNN), a state-space (S-S) DNN (S-SDNN), a deconvolution network, a deep belief network (DBN), a restricted Boltzmann machine (RBM), a fully convolutional network, a long short-term memory (LSTM) network, and a classification network.

The GPU 160 may speed up a computational operation of the neural network system 100. The GPU 160 may include the plurality of processor cores (or the multi-core), operate by being connected to another GPU (not shown) via the CPU 110, a peripheral component interconnect express (PCIe), and VLINK, and accelerate a universal math operation via compute unified device architecture (CUDA). The GPU 160 may process or execute programs and/or data stored in a storage area such as the memory 130.

The neural network device 120 may perform a neural network operation based on the received input data. Furthermore, the neural network device 120 may generate an information signal based on a result of the neural network operation. The neural network device 120 may be implemented as a neural network operation accelerator, a coprocessor, a digital signal processor (DSP), an application specific integrated circuit (ASIC), etc.

Figure 2:
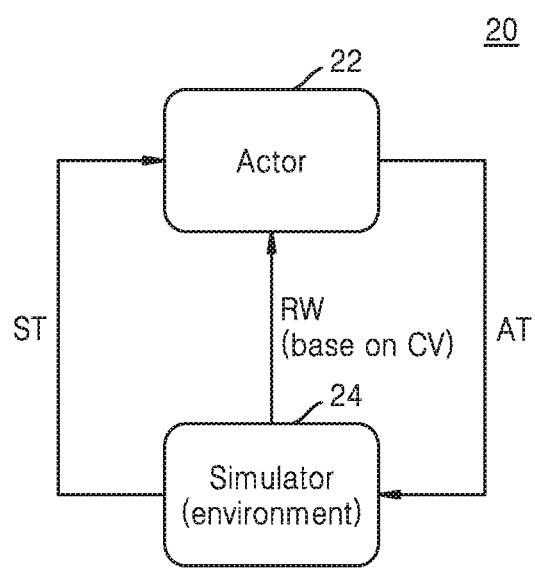
FIG. 2 is a block diagram for explaining an operation of a verification vector generator according to an embodiment.

The neural network device 120 may include a verification vector generator 20 of FIG. 2 that generates the verification vector for verifying the circuit design. The verification vector generator 20 according to an embodiment may generate verification vectors suitable for verification of each of a plurality of circuit blocks included in a circuit design through coverage-based reinforcement learning. The coverage may denote a performance measure of a test vector used to search for the verification vector suitable for verification of a circuit block. When the test vector is input to the circuit block, the coverage may be determined (or computed) based on a state transition of the circuit block, and details of the coverage are described with reference to FIGS. 3A and 3B.

The verification vector generator 20 according to an embodiment may perform the reinforcement learning through neural network computation based on the coverage corresponding to the test vector that is determined based on the state transition of the generated circuit block by inputting the test vector to the circuit block, and may determine the verification vector suitable for the circuit block. In other words, the verification vector generator 20 may generate a reward according to a change of the coverage and apply the generated reward to the reinforcement learning such that the test vector is changed in a direction in which the coverage, or an evaluation standard, continuously increases through the reinforcement learning. As a result, the verification vector generator 20 may determine the test vector corresponding to the coverage equal to or greater than a reference coverage as the verification vector.

The verification vector generator 20 according to an embodiment may decrease information loss by compressing a repetitive pattern of the test vector used in the reinforcement learning by using the data lossless compression scheme (for example, a run-length encoding) and may maintain an amount of data that a machine learning model is capable of processing. Details of the data lossless compression scheme are described with reference to FIG. 4.

The verification vector generator 20 according to an embodiment may generate the test vector that conforms to verification characteristics of a parameter causing the state transition of the circuit block in the circuit design. When the circuit block has first verification characteristics, the verification vector generator 20 may perform a first reinforcement learning of a first method, and when the circuit block has second verification characteristics, the verification vector generator 20 may perform a second reinforcement learning of a second method. In other words, the verification vector generator 20 may reduce time and simulation cost to determine the verification vector by performing a different reinforcement learning according to the verification characteristics of the circuit block. Details of the verification characteristics of the circuit block are described with reference to FIG. 5, and details of various methods of the reinforcement learning are described with reference to FIGS. 7A and 10A, and the like. In addition, the neural network device 120 may further include a design verifier (not shown). The design verifier (not shown) may perform verification of the circuit design by using the verification vector generated by the verification vector generator 20.

The memory 130 may store programs and/or data used in the neural network system 100. The memory 130 may also store computation parameters (for example, reward values, weight values, bias values, etc.) for the neural network, parameters for quantization of the neural network (for example, scale factors, bias values, etc.), input data (for example, the test vector), and output data (for example, a state of the circuit block).

The memory 130 may include dynamic random-access memory (RAM) (DRAM), but is not limited thereto. The memory 130 may include at least one of a volatile memory and a nonvolatile memory. In this specification, the phrase "at least one of A and B" includes "only one A", "only one B", and "both A and B". The non-volatile memory may include read only memory (ROM), programmable ROM (PROM), electrically programmable ROM (EPROM), electrically erasable and programmable ROM (EEPROM), a flash memory, etc. The volatile memory may include dynamic RAM (DRAM), static RAM (SRAM), synchronous DRAM (SDRAM), phase-change RAM (PRAM), magnetic RAM (MRAM), resistive RAM (RRAM), ferroelectric RAM (FeRAM), etc. In an embodiment, the memory 130 may include at least one of a hard disk drive (HDD), a solid state drive (SSD), a compact flash (CF) card, a secure digital (SD) card, a micro secure digital (micro-SD) card, an extreme digital (xD) card, and a memory stick.

The interface 140 may receive information about the circuit design generated in the circuit design device or the circuit design system on which the neural network system 100 is mounted and provide the received information to the neural network device 120. The neural network device 120 may perform the simulation for the reinforcement learning by using the information about the circuit design.

The neural network device 120 according to an embodiment may efficiently generate the verification vector suitable for each circuit block in the circuit design by performing the reinforcement learning based on a clear evaluation criterion that is called the coverage of the test vector, and may reduce the amount of computations and improve non-uniformity by applying the data lossless compression scheme to the test vector. In addition, the neural network device 120 may reduce the simulation cost by adaptively performing efficient reinforcement learning according to the characteristics related with the parameter causing the state transition of the circuit block.

FIG. 2 is a block diagram for explaining an operation of the verification vector generator 20 according to an embodiment.

Referring to FIG. 2, the verification vector generator 20 may include an actor 22 and a simulator 24 and may perform the reinforcement learning for generating the verification vector suitable for verification of the circuit block by using configurations of the actor 22 and the simulator 24. The actor 22 may provide the simulator 24 with an action AT that includes the test vector. The simulator 24 may include factors that are affected by the action AT as a state or environment in which a certain system (for example, the circuit design) is loaded. The simulator 24 may perform a simulation operation of inputting the test vector included in the action AT to at least one circuit block (or a target circuit block) in the circuit design and outputting the state of the circuit block. The simulator 24 may check whether a state transition ST of the circuit block according to the input of the test vector (or a state transition history of an accumulated circuit block), and a new state transition ST of the circuit block by the test vector have occurred, and may generate a reward RW according to a result of the checking and provide the generated reward RW to the actor 22. In an embodiment, the simulator 24 may compare the state transition history of the circuit block accumulated by the reinforcement learning before the test vector is input to the circuit block, with the state transition ST of the circuit block generated by the test vector after the test vector is input, and generate the reward RW that has a positive or negative value based on a result of the comparison. The simulator 24 may generate the weighted reward RW based on a coverage CV corresponding to the test vector. The simulator 24 may generate a different reward RW according to the degree of change between the coverage CV corresponding to the test vector and the coverage CV corresponding to the state transition history of the circuit block. Details of the reward RW generation are described with reference to FIG. 3B.

Figure 3A:
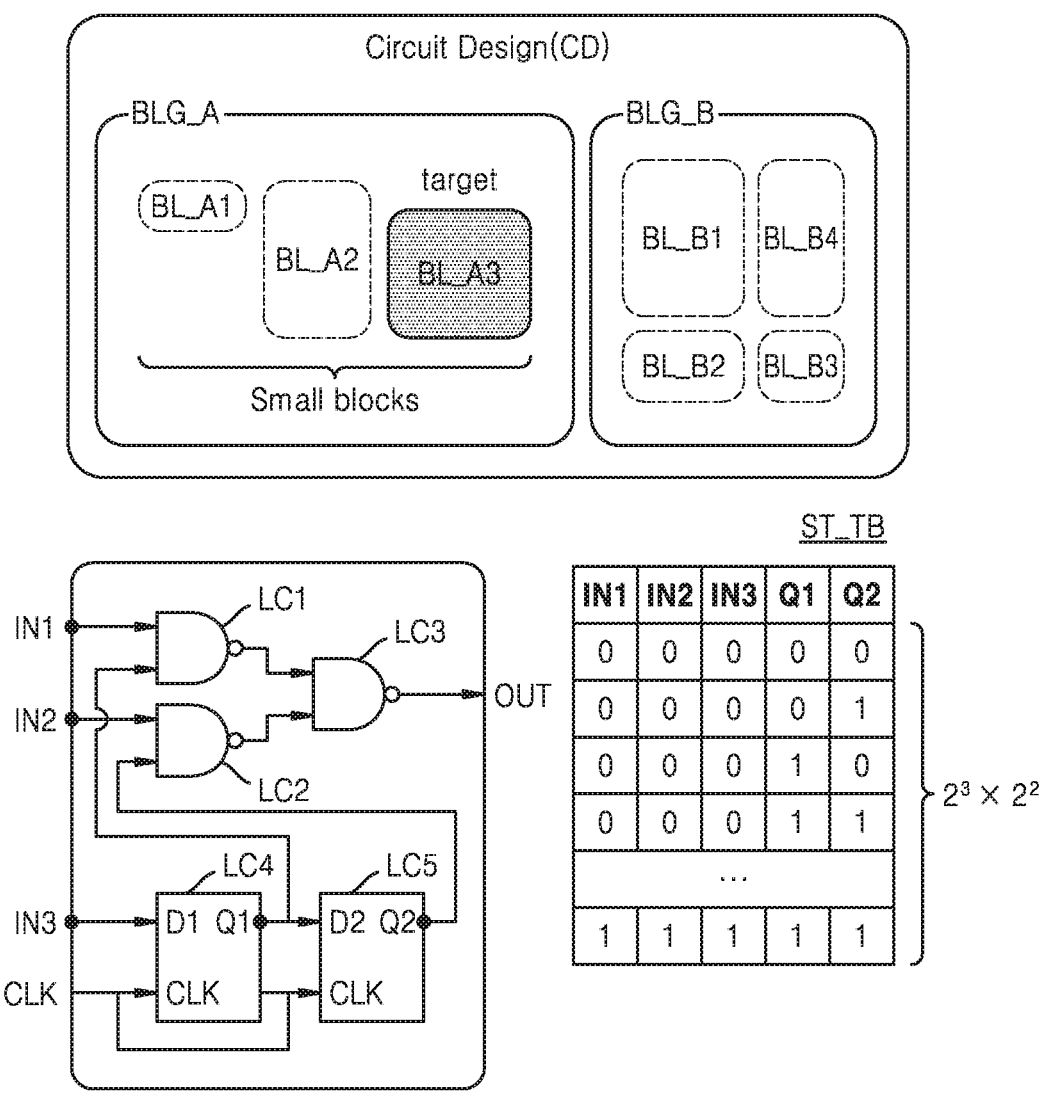
FIG. 3A is a diagram for explaining a coverage according to an embodiment.
Figure 3B:
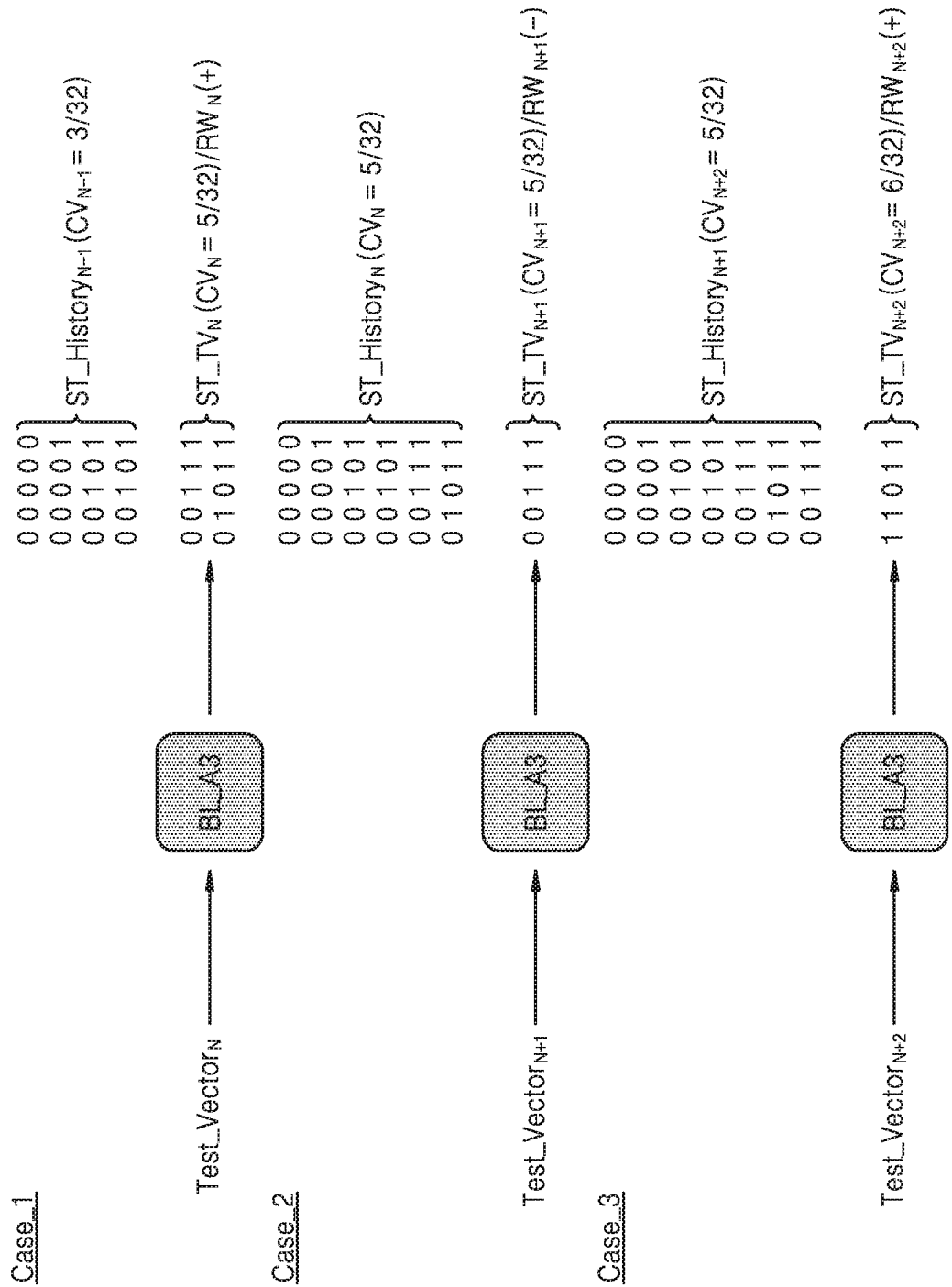
FIG. 3B is a diagram for explaining a coverage-based reward generation method according to an embodiment.

FIG. 3A is a diagram for explaining the coverage CV according to an embodiment, and FIG. 3B is a diagram for explaining a coverage-based reward generation method according to an embodiment.

Referring to FIG. 3A, the verification vector generator 20 in FIG. 2 may generate a plurality of verification vectors for verification of a circuit design CD. First, the circuit design CD may be divided into a first block group BLG_A and a second block group BLG_B according to an arrangement position of a circuit block, the usage of the circuit block, circuit characteristics of the circuit block, parameter-related verification characteristics related with the parameter causing the state transition ST of the circuit block, etc. The verification vector generator 20 in FIG. 2 may perform different types of reinforcement learning for each of the first and second block groups BLG_A and BLG_B. For example, in the verification vector generator 20 in FIG. 2, a first configuration of the test vector for finding the verification vector of the first block group BLG_A may be different from a second configuration of the test vector for finding the verification vector of the second block group BLG_B. However, the verification vector generator 20 in FIG. 2 may employ the same coverage CV as an evaluation reference in performing the reinforcement learning for each of the first and second block groups BLG_A and BLG_B. The circuit design CD illustrated in FIG. 3A is merely an example embodiment and is not limited thereto, and may include more or fewer circuit blocks that is shown in FIG. 3A.

The first block group BLG_A may include a first circuit block BL_A1, a second circuit block BL_A2, and a third circuit block BL_A3, and the second block group BLG_B may include a first circuit block BL_B1, a second circuit block BL_B2, a third circuit block BL_B3, and a fourth circuit block BL_B4. In an embodiment, when the circuit design CD includes a DRAM circuit design, the first block group BLG_A may include MRS blocks in which the state transition ST of the circuit block occurs due to setting of MRS values, and the second block group BLG_B may include command blocks in which the state transition ST of the circuit block occurs through an input of commands. A verification vector generation method for a case in which the circuit design CD is a DRM circuit design is described in detail with reference to FIG. 5. However, this case is merely illustrative and is not limited thereto, and the technical idea of the inventive concept may be applied to the reinforcement learning that determines the verification vector of any of various types of circuit designs.

Hereinafter, descriptions are given assuming that the third circuit block BL_A3 in the first block group BLG_A is a target of the reinforcement learning. The third circuit block BL_A3 may include a first logic circuit LC1, a second logic circuit LC2, a third logic circuit LC3, a fourth logic circuit LC4, and a fifth logic circuit LC5. A state of the third circuit block BL_A3 may be defined by the input or output of the first through fifth logic circuits LC1 through LC5. In other words, the state of the third circuit block BL_A3 may be defined by a first input N1 of the first logic circuit LC1, a second input IN2 of the second logic circuit LC2, a third input IN3 of the fourth logic circuit LC4, an output Q1 of the fourth logic circuit LC4, and an output Q2 of the fifth logic circuit. Possible state transitions ST of the third circuit block BL_A3 in the embodiment shown in FIG. 3A may have 32 cases as summarized in a state table ST TB. However, the third circuit block BL_A3 may have a state transition ST that has no possibility of occurrence due to an original design purpose, and this case may be considered when the coverage CV is computed. The coverage CV according to embodiments may be determined on a circuit block basis, and the coverage CV may be determined by observing not only the state transition ST of one node in the circuit block, but also a change of a set including some or all of the inputs or outputs of logic circuits in the circuit block.

In an embodiment, in the case of the MRS block, a state of the MRS block may be defined by the inputs or outputs of the logic circuits in which the MRS value in the MRS block is set. In addition, in the case of the command block, the state of the command block may be defined by the inputs or outputs of the logic circuits constituting a counter in the command block (for example, a refresh counter in the case of DRAM), a read command first in first out (FIFO), a write command FIFO, etc.

The coverage CV may indicate whether a new state transition ST has occurred in the circuit block when the test vector is input to the circuit block, and the verification vector generator 20 in FIG. 2 may perform coverage-based reinforcement learning until the coverage CV gradually approaches a reference coverage and finally exceeds the reference coverage. The reference coverage may be set in advance and may be set differently depending on circuit design verification environment and a type of the circuit design. The coverage CV corresponding to the test vector may be defined as a value obtained by dividing a value, which is obtained by adding the number of new state transitions ST that have been generated by inputting the test vector to the circuit block and the number of state transitions ST that are not duplicated of the state transition history of the circuit block accumulated by the reinforcement learning before the test vector is input, by the number of all possible state transitions ST of the circuit block. However, this is merely an example embodiment, and is not limited thereto, and the coverage CV may be computed by various mathematical expressions in which the technical idea of the inventive concept is reflected.

Referring further to FIG. 3B, when, in a first case Case_1, the verification vector generator 20 in FIG. 2 inputs an $N^{th}$ test vector Test_Vector$_N$ to the third circuit block BL_A3, two new $N^{th}$ state transitions ST_TV$_N$ may be generated as compared with an $(N-1)^{th}$ state transition history ST_History$_{N-1}$ of the third circuit block BL_A3. Before the $N^{th}$ test vector Test_Vector$_N$ is input to the third circuit block BL_A3, the $(N-1)^{th}$ state transition history ST_History$_{N-1}$ of the third circuit block BL_A3 may include four state transitions ST, but because '00101' corresponds to the duplicated state transition, the $(N-1)^{th}$ state transition history ST_History$_{N-1}$ may include three un-duplicated state transitions ST. Accordingly, an $(N-1)^{th}$ coverage CV$_{N-1}$ corresponding to the $(N-1)^{th}$ state transition history ST_History$_{N-1}$ of the third circuit block BL_A3 may have a value of '3/32'. The $N^{th}$ coverage CV$_N$ corresponding to the $N^{th}$ test vector Test_Vector$_N$ may have a value of '5/32' that is a value obtained by dividing a value, which is a result of adding the number (2) of new $N^{th}$ state transitions ST generated by the $N^{th}$ test vector Test_Vector$_N$ and the number (3) of un-duplicated state transitions ST of the $(N-1)^{th}$ state transition history ST_History$_{N-1}$, by the number (32) of all possible state transitions ST of the third circuit block BL_A3. Since the $N^{th}$ coverage CV$_N$ corresponding to the $N^{th}$ test vector Test_Vector$_N$ has increased to be greater than the previous $(N-1)^{th}$ coverage CV$_{N-1}$, the verification vector generator 20 in FIG. 2 may generate an $N^{th}$ reward RW$_N$ having a positive value and apply the generated $N^{th}$ reward RW$_N$ to the reinforcement learning. Furthermore, the verification vector generator 20 in FIG. 2 may generate the $N^{th}$ reward RW$_N$ which has a value proportional to an amount of change between the $N^{th}$ coverage CV$_N$ corresponding to the $N^{th}$ test vector Test_Vector$_N$ and the previous $(N-1)^{th}$ coverage CV$_{N-1}$.

In a second case Case_2, when an $(N+1)^{th}$ test vector Test_Vector$_{N+1}$ is input to the third circuit block BL_A3, the verification vector generator 20 in FIG. 2 may compare a generated $(N+1)^{th}$ state transition ST of the third circuit block BL_A3 with the $N^{th}$ state transition history ST_History$_N$ and determine that they are duplicates. Before the $(N+1)^{th}$ test vector Test_Vector$_{N+1}$ is input to the third circuit block BL_A3, the $N^{th}$ state transition history ST_History$_N$ of the third circuit block BL_A3 may include six state transitions ST, but because '00101' corresponds to the duplicated state transitions ST, the $N^{th}$ state transition history ST_History$_N$ may include five un-duplicated state transitions ST. Accordingly, the $N^{th}$ coverage CV$_N$ corresponding to the $N^{th}$ state transition history ST_History$_N$ of the third circuit block BL_A3 may have a value of '5/32'. Because an $(N+1)^{th}$ coverage CV$_{N+1}$ corresponding to the $(N+1)^{th}$ test vector Test_Vector$_{N+1}$ does not have a new state transition ST generated by the $(N+1)^{th}$ test vector Test_Vector$_{N+1}$, the $(N+1)^{th}$ coverage CV$_{N+1}$ may have the same value of '5/32' as the previous $N^{th}$ coverage CV$_N$. Since the $(N+1)^{th}$ coverage CV$_{N+1}$ corresponding to the $(N+1)^{th}$ test vector Test_Vector$_{N+1}$ is the same as the previous $N^{th}$ coverage CV$_N$, the verification vector generator 20 in FIG. 2 may generate an $(N+1)^{th}$ reward RW$_{N+1}$ having a negative value and apply the generated $(N+1)^{th}$ reward RW$_{N+1}$ to the reinforcement learning.

In a third case Case_3, when an $(N+2)^{th}$ test vector Test_Vector$_{N+2}$ is input to the third circuit block BL_A3, the verification vector generator 20 in FIG. 2 may compare a generated $(N+2)^{th}$ state transition of the third circuit block BL_A3 with the $(N+1)^{th}$ state transition history ST_History$_{N+1}$ and generate a new $(N+2)^{th}$ state transition ST_TV$_{N+2}$. Before an $(N+2)^{th}$ test vector Test_Vector$_{N+2}$ is input to the third circuit block BL_A3, the $(N+1)^{th}$ state transition history ST_History$_{N+1}$ of the third circuit block BL_A3 may include seven state transitions ST, but because '00101' and '00111' correspond to the duplicated state transitions, the $N^{th}$ state transition history ST_History$_N$ may include five un-duplicated state transitions ST. Accordingly, the $N^{th}$ coverage CV$_N$ corresponding to the $(N+1)^{th}$ state transition history ST_History$_{N+1}$ of the third circuit block BL_A3 may have a value of '5/32'. The $(N+2)^{th}$ coverage CV$_{N+2}$ corresponding to the $(N+2)^{th}$ test vector Test_Vector$_{N+2}$ may have a value of '6/32' that is a value obtained by dividing a value, which is a result of adding the number (1) of new $(N+2)^{th}$ state transitions ST_TV$_{N+2}$ generated by the $(N+2)^{th}$ test vector Test_Vector$_{N+2}$ and the number (5) of un-duplicated state transitions ST of the $(N+1)^{th}$ state transition history ST_History$_{N+1}$, by the number (32) of all possible state transitions ST of the third circuit block BL_A3. Since the $(N+2)^{th}$ coverage CV$_{N+2}$ corresponding to the $(N+2)^{th}$ test vector Test_Vector$_{N+2}$ has increased to be greater than the previous $(N+1)^{th}$ coverage CV$_{N+1}$, the verification vector generator 20 in FIG. 2 may generate an $(N+2)^{th}$ reward RW$_{N+2}$ having a positive value and apply the generated $(N+2)^{th}$ reward RW$_{N+2}$ to the reinforcement learning. Furthermore, the verification vector generator 20 in FIG. 2 may generate the $(N+2)^{th}$ reward RW$_{N+2}$, which has a value proportional to an amount of change between the $(N+2)^{th}$ coverage CV$_{N+2}$ corresponding to the $(N+2)^{th}$ test vector Test_Vector$_{N+2}$ and the previous $(N+1)^{th}$ coverage CV$_{N+1}$. At this time, the $N^{th}$ reward RW$_N$ of the first case Case_1 may have a value greater than the $(N+2)^{th}$ reward RW$_{N+2}$ of the third case Case_3.

As described with reference to FIG. 3B, the verification vector generator 20 in FIG. 2 may perform the coverage-based reinforcement learning until a coverage is greater than or equal to a reference coverage.

Figure 4:
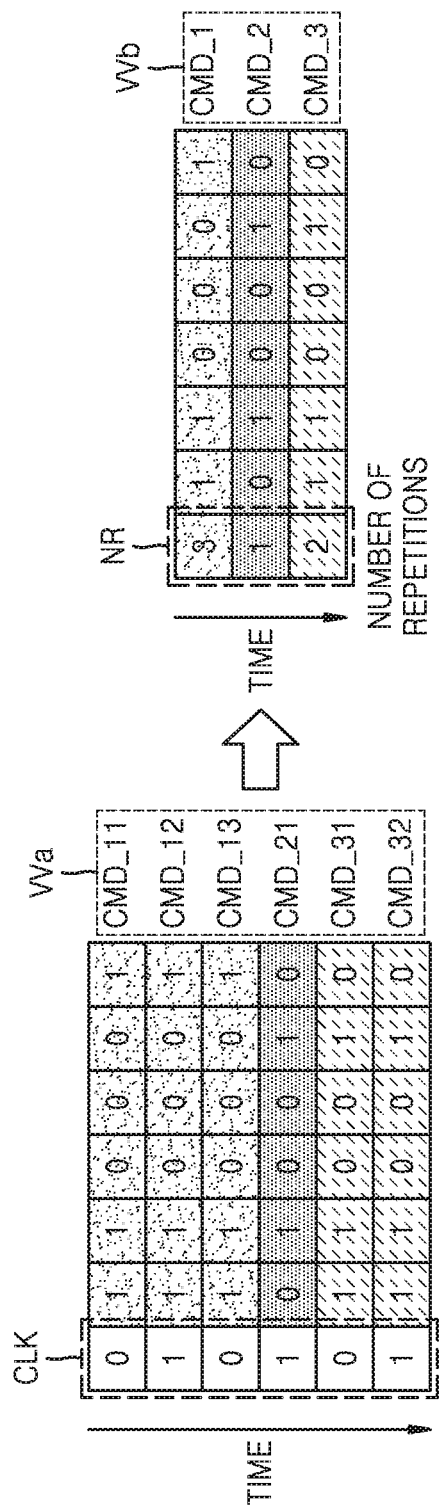
FIG. 4 is a diagram for explaining a data lossless compression scheme applied to a test vector in reinforcement learning according to an embodiment.

FIG. 4 is a diagram for explaining a data lossless compression scheme applied to a test vector in reinforcement learning according to an embodiment. Hereinafter, descriptions are given assuming that the test vector includes a plurality of commands.

Referring to FIG. 4, a test vector VVa may include a plurality of commands (CMD_11, CMD_12, CMD_13, CMD_21, CMD_31, and CMD_32) that are arranged on a time axis and may include a clock signal CLK corresponding to each of the plurality of commands (CMD_11, CMD_12, CMD_13, CMD_21, CMD_31, and CMD_32). The commands (CMD_11, CMD_12, and CMD_13) may be duplicate commands having an identical value of '110001', and the commands (CMD_31 and CMD_32) may be duplicate commands having an identical value of '110010'. In other words, the test vector VVa may include commands that are repeated in succession, and these repeated commands may be a factor that inefficiently increases the amount of computations during the reinforcement learning for finding a verification vector.

The verification vector generator 20 in FIG. 1 according to an embodiment may apply a data lossless compression scheme on the test vector VVa and generate a compressed test vector VVb. In one example, the verification vector generator 20 in FIG. 1 may encode the test vector VVa by using a run-length encoding scheme and generate the compressed test vector VVb.

The compressed test vector VVb may include a plurality of commands (CMD_1, CMD_2, and CMD_3) that are different from each other, and the number of repetitions NR of each of the commands (CMD_1, CMD_2, and CMD_3). In other words, in the example shown in FIG. 4, the value '110001' of CMD_1 has an NR value of 3 and thus is repeated 3 times, the value '010010' of CMD_2 has an NR value of 1 and is repeated 1 time, and the value '110010' of CMD_3 has an NR value of 2 and is repeated 2 times. The verification vector generator 20 in FIG. 1 may reduce a load of the reinforcement learning computation by using the compressed test vector VVb when performing the reinforcement learning according to the technical idea of the inventive concept.

Figure 5:
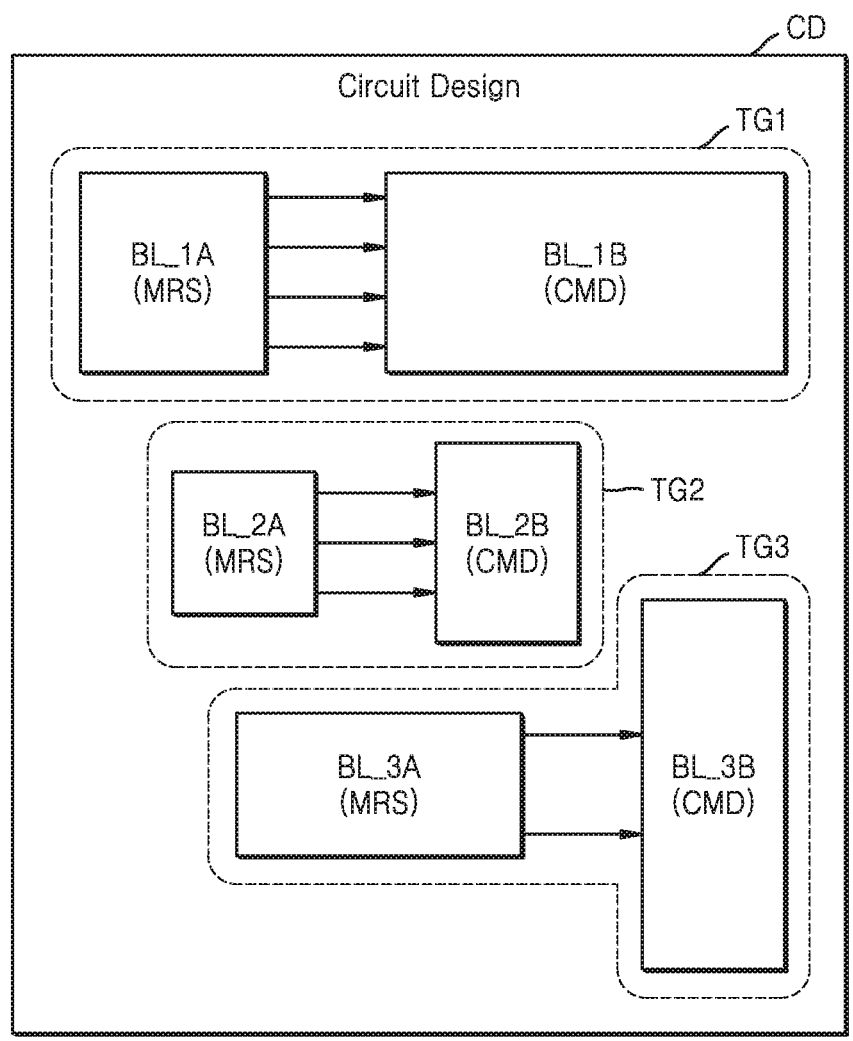
FIG. 5 is a diagram for explaining verification characteristics and a reinforcement learning method of a circuit block according to an embodiment.

FIG. 5 is a diagram for explaining verification characteristics and a reinforcement learning method of a circuit block according to an embodiment. Although the circuit design CD described below is assumed to include a DRAM circuit design, this is merely example and is not limited thereto. The technical idea of the inventive concept may be applicable in determining the verification vector of various circuit designs.

Referring to FIG. 5, the circuit design CD may include a first target group TG1, a second target group TG2, and a third target group TG3. The first target group TG1 may include a first MRS block BL_1A and a first command block BL_1B connected thereto, the second target group TG2 may include a second MRS block BL 2A and a second command block BL_2B connected thereto, and the third target group TG3 may include a third MRS block BL_3A and a third command block BL_3B connected thereto.

In an embodiment, the verification vector generator 20 in FIG. 1 may perform the reinforcement learning sequentially or in parallel to determine the verification vectors suitable for each of the first through third target groups TG1 through TG3. In addition, the verification vector generator 20 in FIG. 1 may determine the order of determination of the verification vectors for the circuit blocks in the first through third target groups TG1 through TG3 according to parameter-related verification characteristics that generate the state transition of the circuit block. When the verification vector generator 20 in FIG. 1 performs the reinforcement learning for the first target group TG1, the verification vector generator in FIG. 1 may primarily perform the reinforcement learning for first determining the verification vector of the first MRS block BL_1A and may perform the reinforcement learning for determining the verification vector of the first command block BL_1B in a state where the determined verification vector is input to the first MRS block BL_1. The reason for this is that a state of the first command block BL_1B tends to be dependent on MRS values that are set in the first MRS block BL_1A. In addition, the verification vector generator 20 in FIG. 1 may efficiently determine the verification vectors of each circuit block by applying a different reinforcement learning scheme by verification characteristics.

In an embodiment, the verification vector generator 20 in FIG. 1 may set a reference coverage used for determining the verification vector of each of circuit blocks (BL_1A through BL_3A, and BL_1B through BL_3B) individually for each of the circuit blocks (BL_1A through BL_3A, and BL_1B through BL_3B), or may set the same reference coverage for particular circuit blocks.

As an example, the verification vector generator 20 in FIG. 1 may individually perform the reinforcement learning for determining the verification vectors of the first through third MRS blocks BL_1A through BL_3A. For example, when the reinforcement learning for determining the first verification vector of the first MRS block BL_1A is performed, and the coverage corresponding to the test vector is equal to or greater than the first reference coverage, the test vector may be determined as the first verification vector. When the reinforcement learning for determining a second verification vector of the second MRS block BL_2A is performed, and the coverage corresponding to the test vector is equal to or greater than a second reference coverage, the test vector may be determined as the second verification vector. When the reinforcement learning for determining a third verification vector of the third MRS block BL_3A is performed, and the coverage corresponding to the test vector is equal to or greater than a third reference coverage, the test vector may be determined as the third verification vector. Here, the first reference coverage, the second reference coverage, and the third reference coverage may be identical to each other or may be different from each other.

As another example, the verification vector generator 20 in FIG. 1 may perform in a manner that at least two reinforcement learnings among the reinforcement learnings for determining the verification vectors of the first through third MRS blocks BL_1A through BL_3A are related with each other. In other words, when an average calculated value of a coverage corresponding to the test vector in performing the reinforcement learning to determine the first verification vector of the first MRS block BL_1A, a coverage corresponding to the test vector in performing the reinforcement learning to determine the second verification vector of the second MRS block BL_2A, and a coverage corresponding to the test vector in performing the reinforcement learning to determine the third verification vector of the third MRS block BL_3A is equal to or greater than one reference coverage, the verification vectors of the first through third MRS blocks BL_1A through BL_3A may be determined. The average computation may correspond to any one of average computation schemes such as an arithmetic mean, a geometric mean, a harmonic mean, and a weighted mean.

The technical idea of the inventive concept that is the basis of the above examples may be applied to the reinforcement learning for determining the verification vectors of the first through third command blocks BL_1B through BL_3B, and furthermore, may be applied to other types of circuit blocks and circuit designs.

Figure 6:
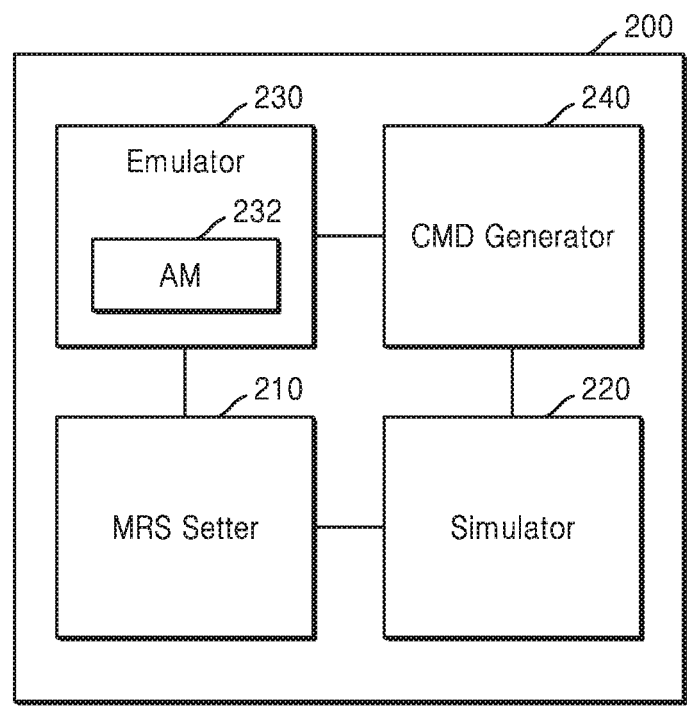
FIG. 6 is a block diagram for explaining an operation of a verification vector generator according to an embodiment.

FIG. 6 is a block diagram for explaining an operation of a verification vector generator 200 according to an embodiment. The verification vector generator 200 described below may perform the reinforcement learning to determine a verification vector for the DRAM circuit design. However, this is merely an example and is not limited thereto, and the verification vector generator 200 may perform the reinforcement learning to determine verification vectors for various circuit designs.

Referring to FIG. 6, the verification vector generator 200 may include an MRS setter 210, a simulator 220, an emulator 230, and a command generator 240. The MRS setter 210 may generate or change a test vector to perform the reinforcement learning for the MRS block. In other words, the MRS setter 210 may generate a test vector including MRS values that are set in the MRS block and provide the generated test vector to at least one of the simulator 220 and the emulator 230. In addition, the MRS setter 210 may change at least one of the MRS values included in the test vector in a direction in which the coverage corresponding to the test vector is improved based on the rewards RW accumulated through the reinforcement learning and the MRS value change pattern information corresponding to each reward RW. Thus, the MRS setter 210 may change at least one of the MRS values included in the test vector when changing the test vector based on the reinforcement learning.

In an embodiment, the simulator 220 may receive the test vector from the MRS setter 210 and perform a simulation operation of inputting the received test vector to the MRS block. The simulator 220 may provide the MRS setter 210 with a reward RW generated on the basis of the state transition ST-related information of the MRS block that is generated at the time of receiving and performing operations, and a coverage corresponding to the determined test vector based on the state transition ST-related information, and may apply the generated reward RW to the reinforcement learning of the MRS block. In other words, the MRS setter 210 may perform the reinforcement learning for the MRS block by performing the operation of the actor 22 of FIG. 2.

In another embodiment, the emulator 230 may receive a plurality of test vectors including all possible MRS values from the MRS setter 210 and may generate an approximate model (AM) 232 by using the plurality of test vectors. For example, the emulator 230 may generate the AM 232 in advance by performing a machine learning based on a supervised learning algorithm on a state transition ST trend of the MRS circuit block by using the plurality of test vectors. The emulator 230 may generate one AM 232 corresponding to a plurality of MRS blocks, or a plurality of approximate models AM respectively corresponding to the MRS blocks.

The AM 232 may be stored in a memory area of the emulator 230 or in a separate memory area. The MRS setter 210 may provide a test vector to the AM 232 when performing the reinforcement learning for the MRS block, and may receive at least one reward RW and the coverage CV corresponding to the test vector without complicated computations from the AM 232. In other words, the emulator 230 may generate, to simplify a computation for the reinforcement learning, the AM 232 by modeling the trend of the state transition ST of the MRS block according to all the values that the test vector is capable of having in advance, and the MRS setter 210 may easily and quickly perform the reinforcement learning for the MRS block by using the AM 232. Detailed contents of the reinforcement learning for the MRS block are described with reference to FIG. 7A.

The command generator 240 may generate or change the test vector to perform the reinforcement learning for the command block. In other words, the command generator 240 may generate the test vector including a plurality of commands and provide the generated test vector to at least one of the simulator 220 and the emulator 230. In addition, the command generator 240 may change at least one of the MRS values included in the test vector in a direction in which the coverage CV corresponding to the test vector is improved based on the rewards RW accumulated through the reinforcement learning and the command pattern information corresponding to each reward RW. Thus, the command generator 240 may add at least one command to the test vector when changing the test vector based on the reinforcement learning.

In an embodiment, the simulator 220 may receive the test vector from the command generator 240 and perform a simulation operation of inputting the received test vector to the command block. By providing the command generator 240 with the reward RW, which is generated based on the state transition ST-related information of the command block generated during the simulation operation, and the coverage CV corresponding to the test vector determined based on the state transition ST-related information, the simulator 220 may apply the generated reward RW to the reinforcement learning of the command block. In other words, the command generator 240 may perform the reinforcement learning for the command block by performing the operation of the actor 22 of FIG. 2.

In another embodiment, the simulator 220 may receive a start test vector that includes a plurality of commands from the command generator 240 and may generate a state transition history of the command block generated by inputting the start test vector. Thereafter, the simulator 220 may generate the reward RW for each command by back-tracking the generated state transition history of the command block and perform a reward mapping for each command. The state transition history may have a form of a simulation log file, and the simulator 220 may generate the reward RW for each command based on a log back-tracking scheme for a simulation log file.

The simulator 220 may provide a reward mapping result for each command to the command generator 240, and the reward mapping result for each command may be applied to the reinforcement learning of the command block. The command generator 240 may add at least one command to the test vector in a direction in which the coverage CV corresponding to the test vector is improved based on the reinforcement learning and may provide the added command to the simulator 220. Thereafter, the simulator 220 may perform the simulation operation in which the added command is input to the command block and may apply the generated reward RW to the reinforcement learning of the command block, by providing the command generator 240 with the reward RW that is generated based on the state transition ST-related information of the command block that has been generated and the coverage corresponding to the test vector that has been determined based on the state transition ST-related information. Details of the reinforcement learning for the command block are described with reference to FIG. 10A.

The embodiment described with reference to FIG. 6 is an example, and is not limited thereto, and the reinforcement learning for determining the verification vector of the command block may be performed by using the AM 232 generated from the emulator 230 by using the plurality of test vectors including all possible command patterns. In addition, the reinforcement learning for determining the verification vector of the MRS block may be performed by performing the back-tracking operation on the state transition history of the MRS block generated by the initial test vector having various MRS values and a reward mapping operation for each MRS value. Furthermore, it may be clear that the AM 232, the back-tracking, and the reward mapping described above are used for the reinforcement learning for determining verification vectors for different kinds of circuit blocks and circuit designs.

Figure 7A:
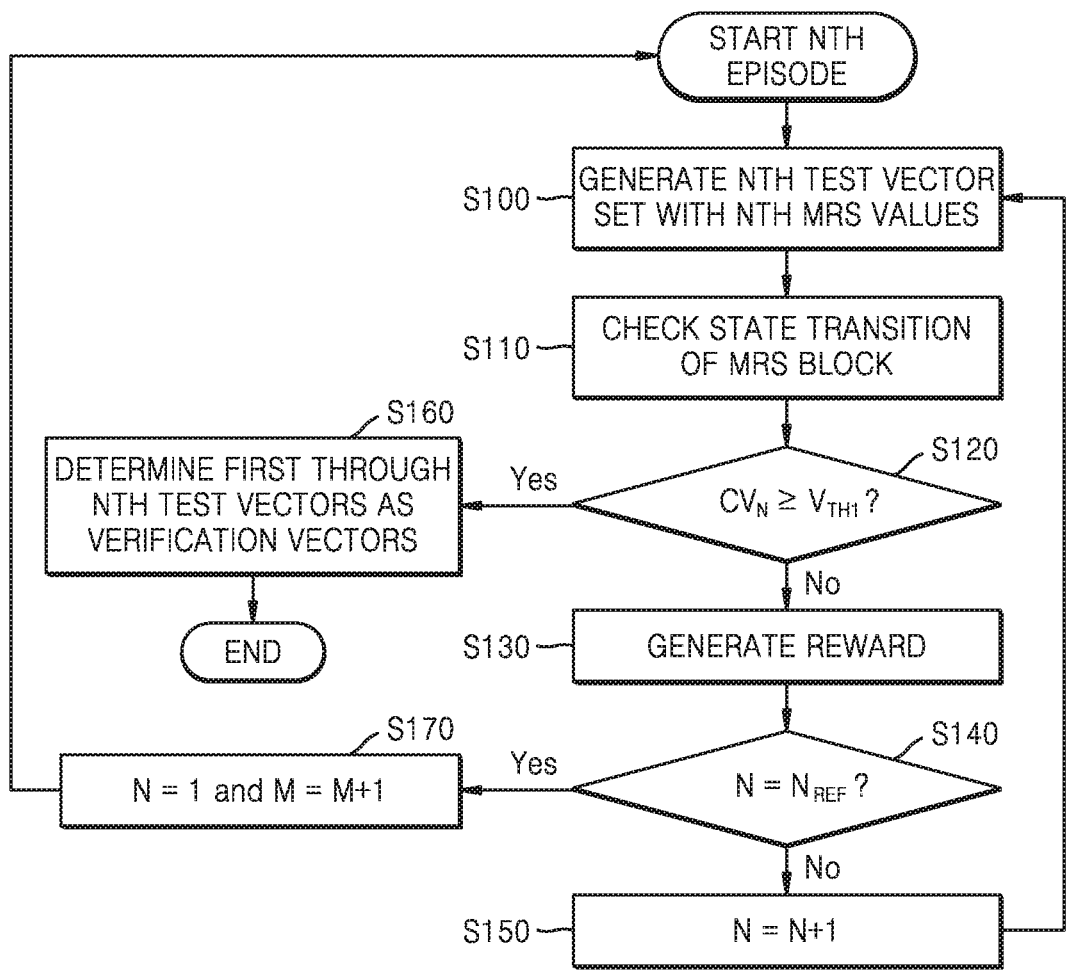
FIG. 7A is a flowchart illustrating a reinforcement learning operation for determining a verification vector of a mode register set (MRS) block according to an embodiment.
Figure 7B:
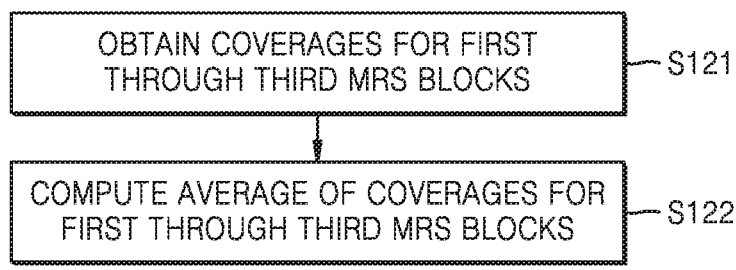
FIG. 7B is a flowchart for explaining an embodiment of operation S120 in FIG. 7A.

FIG. 7A is a flowchart of the reinforcement learning operation for determining the verification vector of the MRS block according to an embodiment, and FIG. 7B is a flowchart of an embodiment of operation S120 in the flowchart of FIG. 7A.

Referring to FIG. 7A, the verification vector generator 20 may perform the reinforcement learning according to at least one episode to determine the verification vector of the MRS block. First, starting from any $M^{th}$ (M is an integer equal to or greater than 1) episode, the verification vector generator 20 may generate an $N^{th}$ (N is an integer equal to or greater than 1) test vector that is set by the $N^{th}$ MRS values (S100). The verification vector generator 20 may check the state transition of the MRS block (S110). For example, the verification vector generator 20 may perform the simulation operation of inputting the $N^{th}$ test vector to the MRS block and check the state transition of the MRS block. The verification vector generator 20 may determine whether the $N^{th}$ coverage $CV_N$ corresponding to the $N^{th}$ test vector (for example, a cumulative coverage from the first test vector to the $N^{th}$ test vector) is equal to or greater than a reference coverage $V_{TH1}$ (S120).

When a result of the determination of operation S120 is 'No', the verification vector generator 20 may generate the reward RW having a positive or negative value depending on whether a new state transition of the MRS block has been generated by the $N^{th}$ test vector (S130). The verification vector generator 20 may determine whether the current N has reached a reference number $N_{REF}$ (S140). When a result of the determination of operation S140 is 'No', the verification vector generator 20 may increase N by 1 (S150) and repeatedly perform operation S100 based on the reward RW generated in operation S130.

When the result of the determination of operation S120 is 'Yes', the verification vector generator 20 may determine first through $N^{th}$ test vectors as verification vectors (S160).

When the result of the determination of operation S140 is 'Yes', the verification vector generator 20 may initialize N to 1 and increase M by 1 (S170). Thereafter, the verification vector generator 20 may prepare the reinforcement learning corresponding to a next $(M+1)^{th}$ episode by performing the reinforcement learning by using the rewards RW generated through the $M^{th}$ episode. In other words, operations S100 through S150 corresponding to the $(M+1)^{th}$ episode may be performed based on the reinforcement learning that has been performed in the $M^{th}$ episode. In an embodiment, the reinforcement learning may use a scheme such as a policy gradient.

The $N^{th}$ test vector may be determined as the first verification vector. However, since the coverage corresponding to the first verification vector does not satisfy a condition of being equal to or greater than the reference coverage $V_{TH1}$, the verification vector generator 20 may determine the second verification vector that compensates the first verification vector. The verification vector generator 20 may select a test vector, as a second verification vector, that complements the first verification vector among the plurality of test vectors generated while performing the reinforcement learning. However, this is merely an example and is not limited thereto, and the number of test vectors selected to compliment the first verification vector may be plural.

Referring to FIG. 7B, while FIG. 7A illustrates an embodiment of the reinforcement learning for the first MRS block BL_1A, the verification vector generator 20 may perform the reinforcement learning for the second MRS block BL_2A and the third MRS block BL_3A in parallel. The verification vector generator 20 may obtain coverages CV for the first through third MRS blocks BL_1A through BL_3A (S121). The coverages CV for the first through third MRS blocks BL_1A through BL_3A may include a first coverage corresponding to a certain test vector input to the first MRS block BL_1A, a second coverage corresponding to a certain test vector input to the second MRS block BL_2A, and a third coverage corresponding to a certain test vector input to the third MRS block BL_3A. The verification vector generator 20 may compute an average of the coverages CV for the first through third MRS blocks BL_1A through BL_3A (S122). Thereafter, the computed average may be applied to the $N^{th}$ coverage $CV_N$ in operation S120 in FIG. 7A and compared with the reference coverage $V_{TH1}$.

Since descriptions thereof have been given above, detailed descriptions thereof are omitted.

Figure 8A:
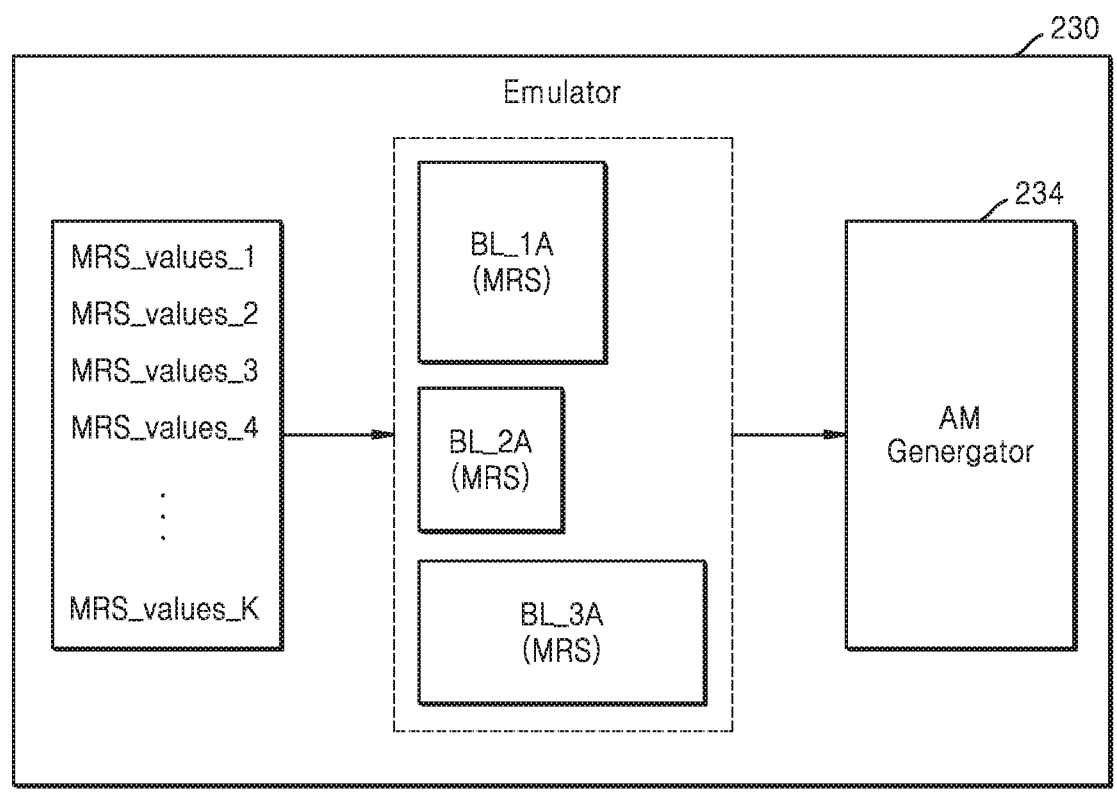
FIG. 8A is a diagram for explaining a method of generating an approximate model according to an embodiment.
Figure 8B:
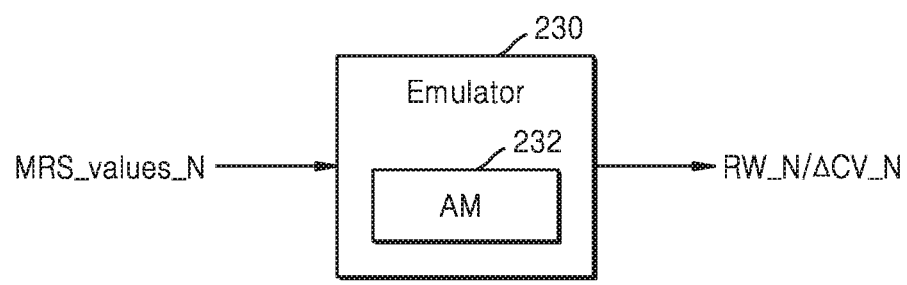
FIG. 8B is a diagram for explaining a method of performing reinforcement learning by using the approximate model according to an embodiment.

FIG. 8A is a diagram for explaining a method of generating the AM 232 according to an embodiment, and FIG. 8B is a diagram for explaining a method of performing the reinforcement learning by using the AM 232 according to an embodiment. Hereinafter, contents of FIGS. 8A and 8B are described with reference to FIG. 6.

Referring to FIG. 8A, the emulator 230 may receive a plurality of test vectors including all possible MRS values (MRS_values_1 through MRS_values_K (K is an integer equal to or greater than 1)) from the MRS setter 210, output sequentially all the MRS values (MRS_values_1 through MRS_values_K) according to various patterns to the first through third MRS blocks BL_1A through BL_3A, and learn the trend of the state transition ST of each of the first through third MRS blocks BL_1A through BL_3A by using an AM generator 234. In an embodiment, the AM generator 234 may perform the machine learning based on a policy gradient algorithm for the state transition ST trends of the first through third MRS blocks BL_1A through BL_3A, and as a result, may generate the AM 232 suitable for the first through third MRS blocks BL_1A through BL_3A. Although descriptions with reference to FIG. 8A focuses on generating the AM 232 by performing a simulation on the first through third MRS blocks BL_1A through BL_3A together at the same time, this is merely an example and is not limited thereto, and the AM 232 suitable for each of the first through third MRS blocks BL_1A through BL_3A may be generated by performing individually the simulation on each of the first through third MRS blocks BL_1A through BL_3A. The AM 232 generated in this manner may be used for the reinforcement learning for determining the verification vector of each of the first through third MRS blocks BL_1A through BL_3A.

Referring to FIG. 8B, the emulator 230 may store the AM 232 generated in FIG. 8A. When performing the reinforcement learning to determine the verification vector of the MRS block, the MRS setter 210 may provide the $N^{th}$ test vector having the $N^{th}$ MRS values MRS_values_N to the emulator 230, and by referring to the AM 232, the MRS setter 210 may generate the $N^{th}$ reward $RW_{-N}$ corresponding to the $N^{th}$ test vector without complicated computations. Furthermore, the emulator 230 may generate an $N^{th}$ coverage change amount $\Delta CV\_N$ corresponding to the $N^{th}$ test vector by referring to the AM 232 and generate an $N^{th}$ reward RW N based on the $N^{th}$ coverage change amount $\Delta CV\_N$.

Figure 9:
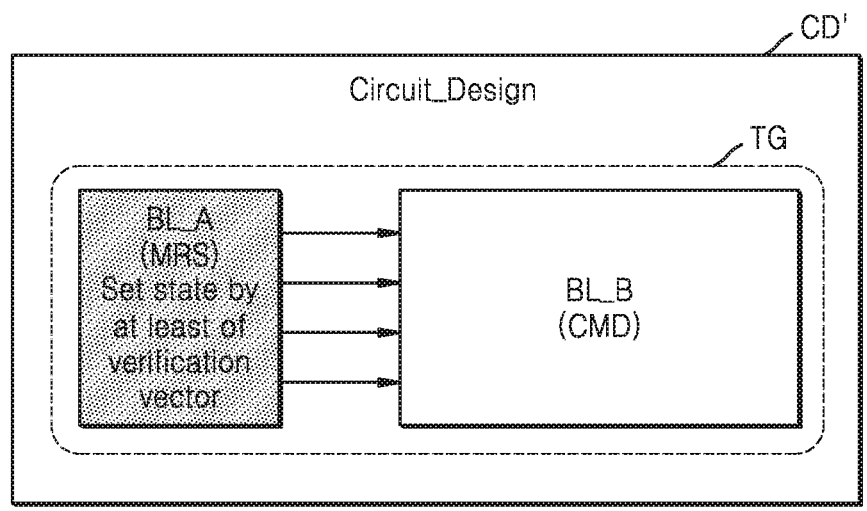
FIG. 9 is a diagram for explaining a method of performing sequential reinforcement learning for each circuit block according to an embodiment.

FIG. 9 is a diagram for explaining a method of performing sequential reinforcement learning for each circuit block, according to an embodiment.

Referring to FIG. 9, a circuit design CD' to be verified may include an MRS block BL_A and a command block BL_B. The verification vector generator 20 according to an embodiment may first perform the reinforcement learning for determining a verification vector of the MRS block BL_A, and after determining at least one verification vector of the MRS block BL_A, may perform the reinforcement learning for determining a verification vector of the command block BL_B. Thus, before starting the reinforcement learning for the command block BL_B, the verification vector generator 20 may set at least one verification vector determined for the MRS block BL_A, and thereafter, may perform the reinforcement learning for the command block BL_B.

Figure 10A:
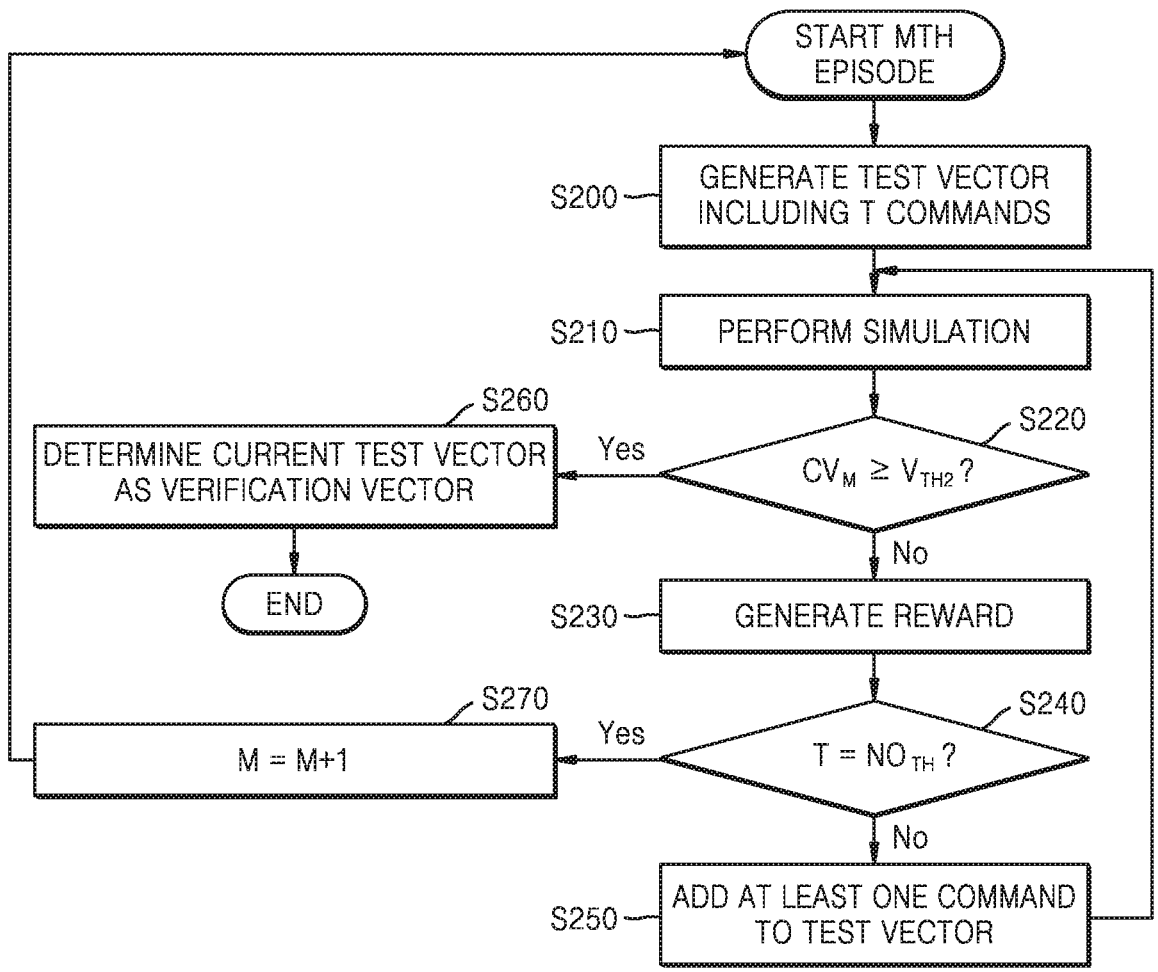
FIG. 10A is a flowchart of a reinforcement learning operation for determining a verification vector of a command block according to an embodiment.
Figure 10B:
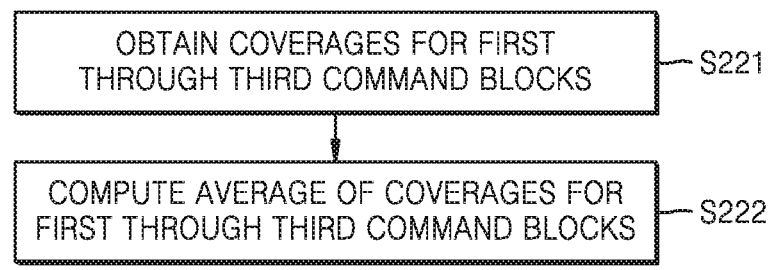
FIG. 10B is a flowchart of an embodiment of operation S220 in the flowchart of FIG. 10A.

FIG. 10A is a flowchart of a reinforcement learning operation for determining a verification vector of a command block, according to an embodiment, and FIG. 10B is a flowchart of an embodiment of operation S220 in the flowchart of FIG. 10A.

Referring to FIG. 10A, the verification vector generator 20 may perform reinforcement learning according to at least one episode to determine the verification vector of a command block. Starting from any $M^{th}$ episode, the verification vector generator 20 may generate a test vector including T (T is an integer equal to or greater than 2) commands to determine the verification vector of the command block (S200). The test vector including the T commands may be generated by using various embodiments. For example, the test vector may include a sequential arrangement of T single commands, or a sequential arrangement of K (K is an integer less than T) command sets, or a sequential arrangement of K command sets according to a certain format designated in advance by those of ordinary skill in the art. The verification vector generator 20 may perform simulation (S210). The verification vector generator 20 may perform the simulation of inputting the test vector to the command block (S210). The T commands may have a certain pattern, and during the simulation, the T commands may be sequentially input to the command block. The verification vector generator 20 may determine whether an $M^{th}$ coverage $CV_M$ corresponding to the test vector is equal to or greater than a reference coverage $V_{TH2}$ (S220). In an example, the $M^{th}$ coverage $CV_M$ corresponding to the test vector may correspond to a value that is obtained by dividing the number of un-duplicated state transitions ST of the command block generated by the test vector (or T commands) by the number of all possible state transitions ST of the command block. When a result of the determination of operation S220 is 'No', rewards RW for the T commands based on the result of the simulation generated in operation S210 may be generated (S230). Embodiments of a reward generation method using simulation results generated by sequentially inputting T commands included in a test vector to a command block are described in detail with reference to FIGS. 11A through 11C, respectively. Thereafter, it is determined whether the number of commands, or T, included in the test vector has reached a reference number $NO_{TH}$ (S240). When a result of the determination of operation S240 is 'No', the reward RW generated in operation S230 may be applied to the reinforcement learning, and at least one command (or a command corresponding to a certain command addition unit) may be added to the test vector based on the reinforcement learning (S250). When the number of commands added to the test vector in operation S250 is one, the number of commands of the test vector may be T+1, and in operation S210, the simulation operation on the command block may be performed by using only the added command. Thereafter, operations S210 through S250 may be repeated until the $M^{th}$ coverage $CV_M$ corresponding to the test vector becomes equal to or greater than the reference coverage $V_{TH2}$, or the number of commands included in the test vector (that is, T) reaches the reference number $NO_{TH}$.

When a result of the determination of operation S220 is 'Yes', the verification vector generator 20 may determine the current test vector as the verification vector (S260). When a result of the determination of operation S240 is 'Yes', the verification vector generator 20 may increase M by 1 (S270) and may prepare the reinforcement learning corresponding to the next $(M+1)^{th}$ episode by performing the reinforcement learning by using the rewards RW generated through the $M^{th}$ episode. In other words, operations S200 through S250 corresponding to the $(M+1)^{th}$ episode may be performed based on a result of the reinforcement learning that has been performed in the $M^{th}$ episode. In an embodiment, the reinforcement learning may use a scheme such as a policy gradient.

Referring to FIG. 10B, while FIG. 10A illustrates an embodiment of the reinforcement learning for the first command block BL_1B, the verification vector generator 20 may perform the reinforcement learning for the second command block BL_2B and the third command block BL_3B in parallel. At this time, the verification vector generator 20 may obtain coverages CV for the first through third command blocks BL_1B through BL_3B (S221). The coverages CV for the first through third command blocks BL_1B through BL_3B may include a first coverage CV corresponding to a certain test vector input to the first command block BL_1B, a second coverage CV corresponding to a certain test vector input to the second command block BL_2B, and a third coverage CV corresponding to a certain test vector input to the third command block BL_3B. The verification vector generator 20 may compute an average of the first through third coverages CV for the first through third command blocks BL_1B through BL_3B (S222). Thereafter, the computed average may be applied to the $M^{th}$ coverage $CV_M$ in operation S220 in FIG. 10A and compared with the reference coverage $V_{TH2}$. Since descriptions of operation S220 have been given above, repeated detailed descriptions thereof are omitted for conciseness.

Figure 11A:
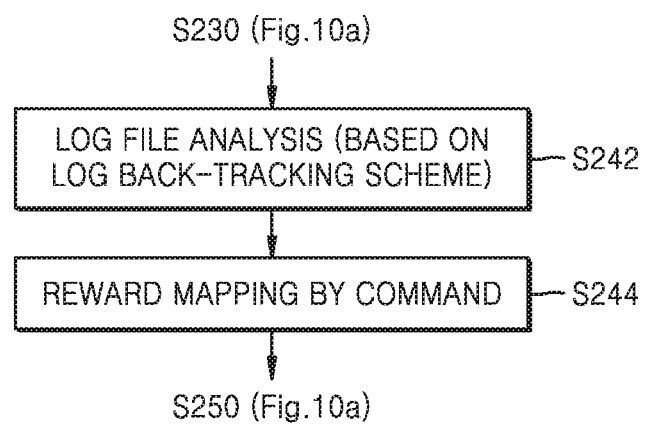
FIG. 11A is a flowchart of an embodiment of operation S230 in the flowchart of FIG. 10A, and FIGS. 11B and 11C are diagrams for explaining a log back-tracking operation and a reward mapping operation according to embodiments, respectively.
Figure 11B:
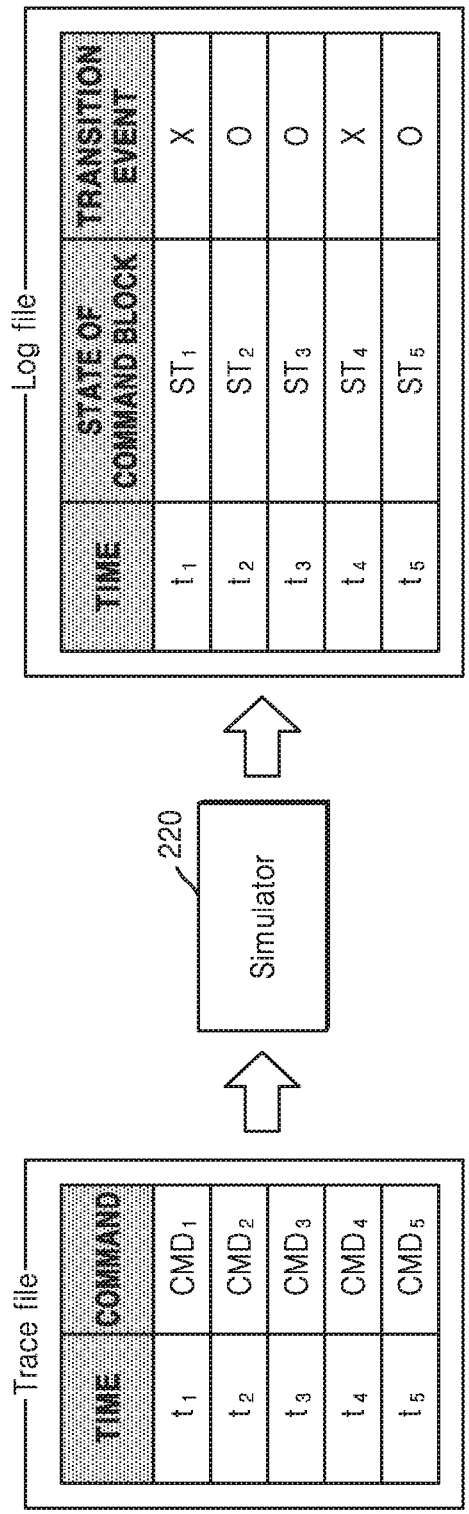
Figure 11C:
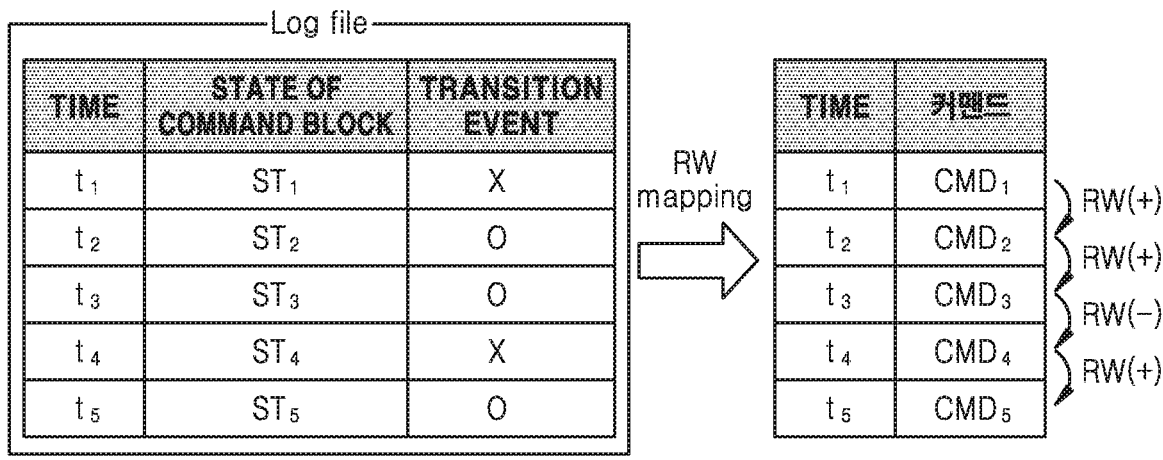

FIG. 11A is a flowchart of an embodiment of operation S230 in the flowchart of FIG. 10A, and FIGS. 11B and 11C are diagrams for explaining a log back-tracking operation and a reward mapping operation according to embodiments, respectively. Hereinafter, descriptions are given assuming that T in FIG. 10A is 5.

Referring to FIGS. 11A and 11B, the simulator 220 may perform the simulation by sequentially inputting first through fifth commands CMD1 through CMD5 in the form of a trace file Trace file included in a test vector to the command block and may generate a log file Log file as a result of the simulation. The log file Log file may include time information in which each of the first through fifth commands CMD1 through CMD5 is input, state information of the command block generated in response to each of the first through fifth commands CMD1 through CMD5, and transition event information. The CMD generator 240 in FIG. 6 may perform log file analysis on the Log file based on the log back-tracking scheme (S242). The command generator 240 may perform the log back-tracking on the log file Log file, and when the second command CMD2, the third command CMD3, and the fifth command CMD5 are input to the command block, the command generator 240 may recognize an occurrence of the state transition ST. Thereafter, the command generator 240 in FIG. 6 may perform the reward mapping on a command-by-command basis by using the transition event information and the time information (S244). Referring further to FIG. 11C, by performing the log back-tracking on the log file Log file, the command generator 240 in FIG. 6 may perform the reward mapping RW mapping on the second command CMD2, the third command CMD3, and the fifth command CMD5 that are input in correspondence with a second time point t2, a third time point t3, and a fifth time point t5, respectively. As an example, the command generator 240 in FIG. 6 may map a positive reward RW(+) for the second command CMD2, the third command CMD3, and the fifth command CMD5 and may map a negative reward RW(−) for the first and fourth commands CMD1 and CMD4. Through these operations, the command generator 240 in FIG. 6 may perform the reinforcement learning that maps the positive reward RW(+) for commands that increase the coverage CV corresponding to the test vector, and as a result, at least one command may be added in the direction in which the coverage CV corresponding to the test vector increases in operation S250 in FIG. 10A.

Figure 12:
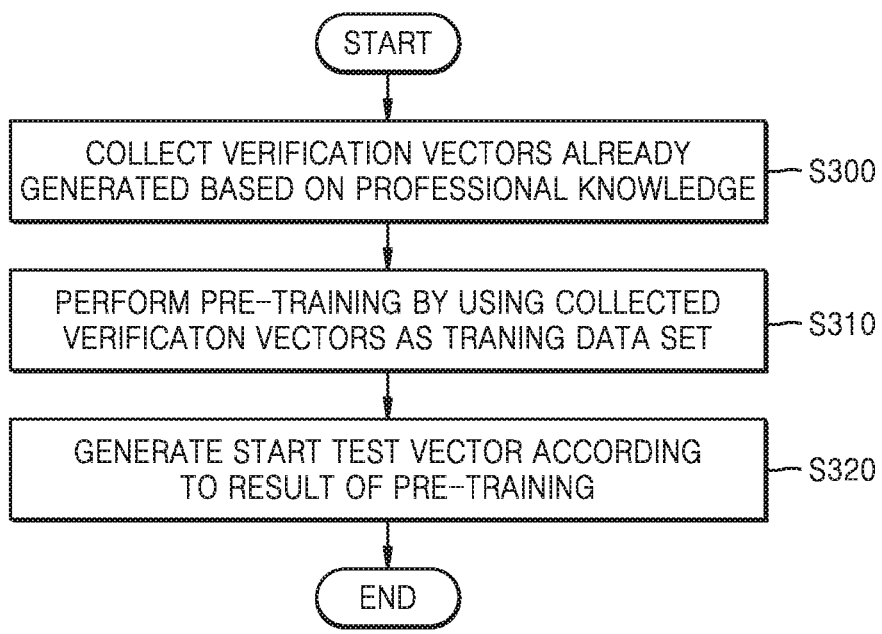
FIG. 12 is a flowchart of a method of generating a start test vector, according to an embodiment.

FIG. 12 is a flowchart of a method of generating a start test vector, according to an embodiment. The start test vector may denote a test vector that is first input to the circuit block during the reinforcement learning to determine the verification vector of the circuit block.

The verification vector generator 20 may collect the verification vectors, which have already been generated based on the professional domain knowledge of verification specialists, to use the verification vectors as a training data set for the supervised learning (S300). The verification vector generator 20 may perform a pre-training based on the supervised learning scheme by using the collected verification vectors as the training data set (S310). The verification vector generator 20 may generate the start test vector according to a result of the pre-training (S320). The verification vector generator 20 may decrease the amount of computations of the reinforcement learning to be performed in the future through the pre-training to generate the start test vector.

Figure 13:
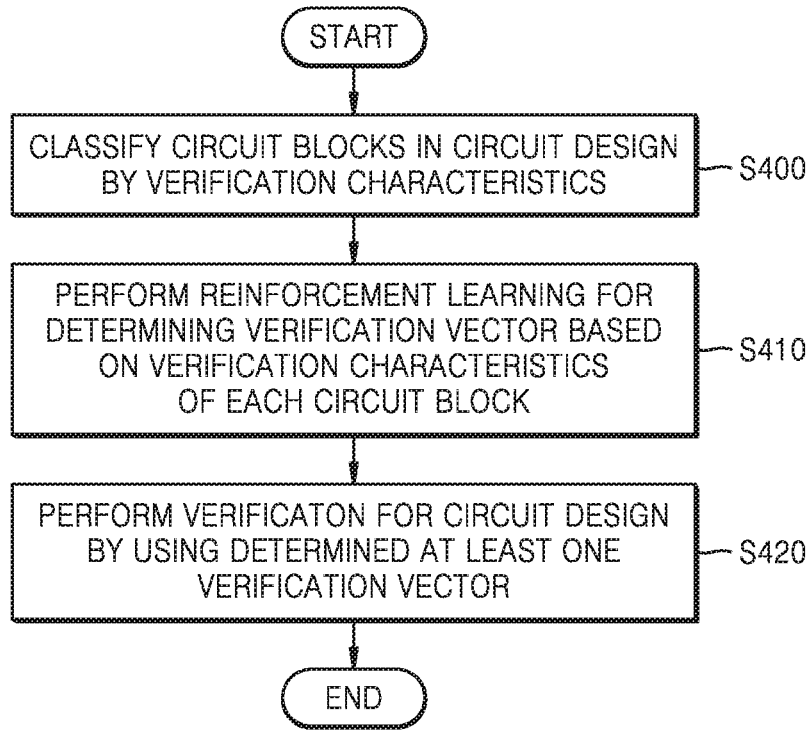
FIG. 13 is a flowchart of a circuit design verification method according to an embodiment.

FIG. 13 is a flowchart of a circuit design verification method according to an embodiment.

Referring to FIG. 13, a device for verifying the circuit design according to an embodiment may classify the circuit blocks in the circuit design to be verified according to verification characteristics (S400). In an example, the verification characteristics may include characteristics related with parameters that cause the state transition ST of the circuit block. In the case of DRAM circuit design, the device may classify the DRAM circuit design into the MRS block and the command block. The device may perform the reinforcement learning for verification vector determination based on the verification characteristics of each circuit block (S410). For example, as described above, the device may perform the reinforcement learning by using the AM 232 for the MRS block and perform the reinforcement learning by using the log back-tracking scheme and the reward mapping RW mapping for the command block. The device may perform verification for the circuit design by using at least one verification vector that has been determined (S420).

Figure 14:
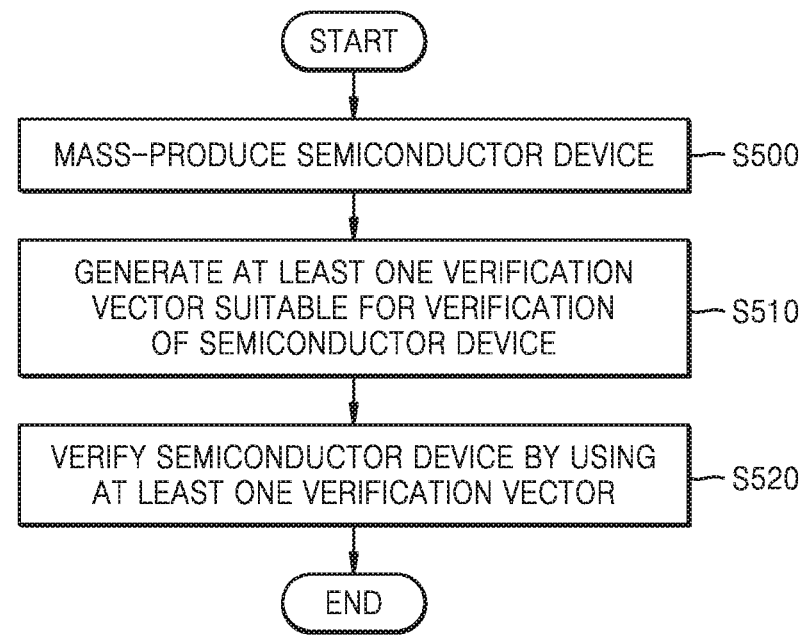
FIG. 14 is a flowchart of a verification method for a mass-produced semiconductor device according to an embodiment.

FIG. 14 is a flowchart of a verification method for a mass-produced semiconductor device according to an embodiment.

Referring to FIG. 14, a semiconductor device is mass-produced (S500), and a test apparatus according to embodiments described above may generate at least one verification vector suitable for verification of the semiconductor device (S510). In an embodiment, the test apparatus may receive the test vector for generating at least one verification vector from the outside, and at this time, the test vector may be in a compressed state (for example, a compressed state in a run-length encoding scheme), and the test apparatus may perform an operation for generating at least one verification vector by decompressing the compressed test vector. The test apparatus may verify the mass-produced semiconductor device by using at least one verification vector (S520).

Figure 15:
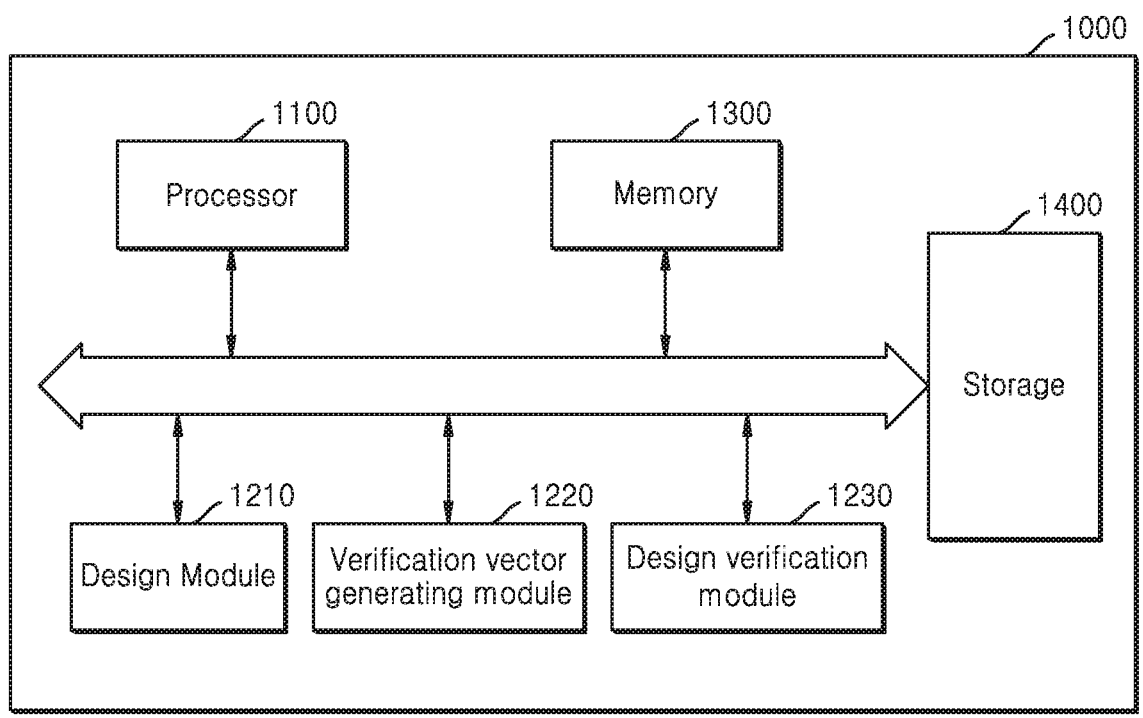
FIG. 15 is a block diagram for explaining a circuit design system according to an embodiment.

FIG. 15 is a block diagram for explaining a circuit design system according to an embodiment.

Hereinafter, a term 'module' may refer to a hardware component such as software or a field programmable gate array (FPGA) or an application specific integrated circuit (ASIC), and the 'module' may perform certain roles. However, a meaning of the 'module' is not limited to software or hardware. The 'module' may be configured to reside in an addressable storage medium, and may be configured to be executed by one or more processors. Accordingly, the 'module' may include, for example, components such as software components, object-oriented software components, class components, and task components, processes, functions, procedures, subroutines, segments of program codes, drivers, firmware, microcode, circuits, data, databases, data structures, tables, arrays, and variables. Function provided in the components and the 'module's may be combined into a smaller number of components and 'modules', or may be further separated into additional components and 'modules'.

Referring to FIG. 15, a circuit design system 1000 may include a processor 1100, a design module 1210, a verification vector generation module 1220, a design verification module 1230, a memory 1300, and a storage 1400. Although only one processor 1100 is illustrated in FIG. 15, more processors may be provided. The design module 1210 may generate a circuit design by using the processor 1100. The verification vector generation module 1220 may use the processor 1100 to perform the coverage-based reinforcement learning to determine verification vectors of circuit blocks in the circuit design according to various embodiments described above. The design verification module 1230 may use the processor 1100 to verify the circuit design by inputting at least one verification vector determined through the coverage-based reinforcement learning to the circuit design and analyzing an output of the circuit design. The memory 1300 may store data that is used by the design module 1210, the verification vector generation module 1220, and the design verification module 1230 for generation of the circuit design, determination of the verification vector, and verification of the circuit design by using the processor 1100. The verified circuit design may be stored in the storage 1400.

A neural network device according to the technical idea of the inventive concept may efficiently generate a verification vector suitable for each circuit block in a circuit design by performing reinforcement learning based on a clear evaluation criterion called a coverage of a test vector, and may reduce the amount of computations and improve non-uniformity by applying a data lossless compression scheme to the test vector.

In addition, the neural network device according to the technical idea of the inventive concept may reduce simulation cost for determining the verification vector by adaptively performing the reinforcement learning suitable for verification characteristics of the circuit block.

As described above, embodiments have been disclosed in the drawings and the specification. While the embodiments have been described herein with reference to specific terms, it should be understood that they have been used only for the purpose of describing the technical idea of the inventive concept and not for limiting the scope of the inventive concept as defined in the claims. Thus, those with ordinary skill in the art will appreciate that various modifications and equivalent embodiments are possible without departing from the scope of the inventive concept. Therefore, the true scope of protection of the inventive concept should be determined by the technical idea of the appended claims.

What is claimed is:

1. A device for verifying a circuit design comprising a first circuit block and a second circuit block, the device comprising:

a verification vector generator configured to determine a first verification vector by performing reinforcement learning through neural network computation based on a coverage corresponding to a first test vector, the coverage being determined based on a state transition of the first circuit block generated by inputting the first test vector to the first circuit block; and a design verifier configured to perform design verification for the first circuit block by using the first verification vector, wherein the verification vector generator is configured to obtain a reward according to a change of the coverage corresponding to the first test vector, and apply the obtained reward to the reinforcement learning.

2. The device of claim 1, wherein the coverage corresponding to the first test vector corresponds to a coverage of a state transition history of the first circuit block in which the first test vector has been finally input to the first circuit block and accumulated through the reinforcement learning.

3. The device of claim 1, wherein the verification vector generator is configured to compare the first test vector with a state transition history of the first circuit block that is accumulated through the reinforcement learning before the first test vector is input to the first circuit block, and when a new state transition of the first circuit block has been generated by the first test vector, generate a first reward of a positive value and apply the generated first reward of the positive value to the reinforcement learning, and when the new state transition of the first circuit block has not been generated by the first test vector, generate a second reward of a negative value and apply the generated second reward of the negative value to the reinforcement learning.

4. The device of claim 1, wherein the reward is obtained by using an approximate model that is generated through learning a trend of the state transition of the first circuit block according to all possible values of the first test vector based on a policy gradient algorithm.

5. The device of claim 1, wherein the verification vector generator is configured to change the first test vector based on the reinforcement learning and perform the reinforcement learning based on a coverage corresponding to the changed first test vector.

6. The device of claim 5, wherein the verification vector generator is configured to change a value of the first test vector or add at least one command to the first test vector to meet verification characteristics for a parameter generating the state transition of the first circuit block.

7. The device of claim 6, wherein the circuit design corresponds to a dynamic random access memory (DRAM) circuit design, and the first circuit block is either a mode register set (MRS) block in which the state transition occurs due to an MRS-related parameter, or a command block in which the state transition occurs due to a command-related parameter.

8. The device of claim 1, wherein the first test vector is compressed by a data lossless compression scheme.

9. The device of claim 1, wherein, when the coverage corresponding to the first test vector is equal to or greater than a reference coverage, the verification vector generator is configured to determine the first test vector as the first verification vector.

10. The device of claim 1, wherein, when the first circuit block is connected to the second circuit block, and first characteristics of a first parameter generating the state transition of the first circuit block are different from second characteristics of a second parameter generating the state transition of the second circuit block, the verification vector generator is configured to perform the reinforcement learning for determining a second verification vector corresponding to the second circuit block while the determined first verification vector is input to the first circuit block.

11. A device for verifying a circuit design comprising a first circuit block and a second circuit block, the device comprising:
a verification vector generator configured to determine a first verification vector by performing reinforcement learning through neural network computation based on a coverage corresponding to a first test vector, the coverage being determined based on a state transition of the first circuit block generated by inputting the first test vector to the first circuit block; and
a design verifier configured to perform design verification for the first circuit block by using the first verification vector,
wherein the first test vector comprises a plurality of commands, and the verification vector generator is configured to generate a reward for each command by back-tracking a state transition history of the first circuit block generated by inputting the first test vector and apply the generated reward to the reinforcement learning.

12. A device for verifying a circuit design comprising a first circuit block and a second circuit block, the device comprising:
a verification vector generator configured to determine a first verification vector by performing reinforcement learning through neural network computation based on a coverage corresponding to a first test vector, the coverage being determined based on a state transition of the first circuit block generated by inputting the first test vector to the first circuit block; and
a design verifier configured to perform design verification for the first circuit block by using the first verification vector,
wherein the verification vector generator is configured to add at least one command to the first test vector based on the reinforcement learning and to perform the reinforcement learning by inputting the added at least one command to the first circuit block.

* * * * *